(12) United States Patent
Appleyard et al.

(10) Patent No.: US 8,860,113 B2
(45) Date of Patent: Oct. 14, 2014

(54) CREATING DEEP TRENCHES ON UNDERLYING SUBSTRATE

(71) Applicant: International Business Machines Corporation, Armonk, NY (US)

(72) Inventors: Jennifer E. Appleyard, Arlington, VA (US); John E. Barth, Williston, VT (US); John B. DeForge, Barre, VT (US); Herbert L. Ho, Cornwall, NY (US); Babar A. Khan, Ossining, NY (US); Kirk D. Peterson, Jericho, VT (US); Andrew A. Turner, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/036,474

(22) Filed: Sep. 25, 2013

(65) Prior Publication Data

US 2014/0021585 A1      Jan. 23, 2014

Related U.S. Application Data

(62) Division of application No. 13/428,004, filed on Mar. 23, 2012, now Pat. No. 8,586,444.

(51) Int. Cl.
*H01L 27/108* (2006.01)

(52) U.S. Cl.
USPC ........... 257/302; 257/301; 257/532; 257/508; 438/244; 438/249; 438/387; 438/392

(58) Field of Classification Search
CPC .................. H01L 27/10829; H01L 27/10861; H01L 29/10867; H01L 27/10881; H01L 29/66181; H01L 29/945
USPC .......... 257/301–302, 508, 532; 438/244, 249, 438/387, 392
See application file for complete search history.

(56) References Cited

U.S. PATENT DOCUMENTS

| | | | |
|---|---|---|---|
| 7,388,244 B2 * | 6/2008 | Ho et al. | 257/301 |
| 7,566,613 B2 | 7/2009 | Furukawa et al. | |
| 7,989,865 B2 | 8/2011 | Barth, Jr. et al. | |
| 8,053,823 B2 * | 11/2011 | Cheng et al. | 257/302 |
| 2006/0202249 A1 | 9/2006 | Cheng et al. | |
| 2008/0116534 A1 | 5/2008 | Grosjean et al. | |

(Continued)

OTHER PUBLICATIONS

Le, Notice of Allowance and Fee(s) Due for U.S. Appl. No. 13/428,004 dated Jul. 9, 2013, 14 pages.

*Primary Examiner* — Dung A. Le
(74) *Attorney, Agent, or Firm* — Michael J. LeStrange; Hoffman Warnick LLC

(57) ABSTRACT

A semiconductor structure is disclosed in which, in an embodiment, a first substrate includes at least one buried plate disposed in an upper part of the first substrate. Each of the at least one buried plate includes at least one buried plate contact, and a plurality of deep trench capacitors disposed about the at least one buried plate contact. A first oxide layer is disposed over the first substrate. The deep trench capacitors and buried plate contacts in the first substrate may be accessed for use in a variety of memory and decoupling applications.

14 Claims, 8 Drawing Sheets

(56) References Cited

U.S. PATENT DOCUMENTS

| | | | |
|---|---|---|---|
| 2008/0283890 A1* | 11/2008 | Dyer | 257/301 |
| 2008/0283891 A1 | 11/2008 | Lee et al. | |
| 2009/0095998 A1* | 4/2009 | Ho et al. | 257/301 |
| 2009/0194844 A1 | 8/2009 | Richter | |
| 2010/0200949 A1 | 8/2010 | Booth, Jr. et al. | |
| 2011/0133310 A1 | 6/2011 | Anderson et al. | |
| 2011/0204429 A1 | 8/2011 | Cho et al. | |
| 2013/0147007 A1 | 6/2013 | Booth, Jr. et al. | |

* cited by examiner

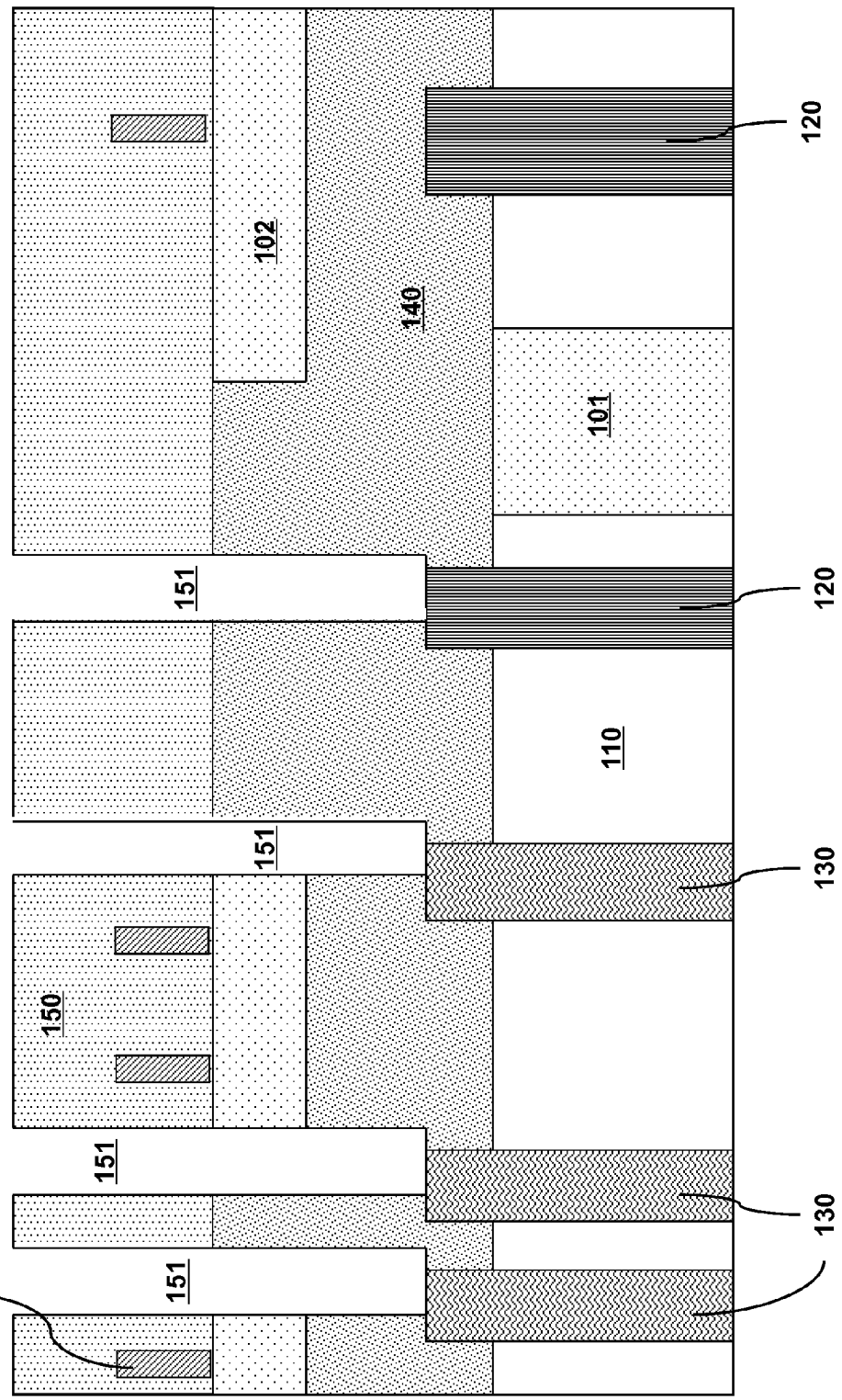

US 8,860,113 B2

CREATING DEEP TRENCHES ON UNDERLYING SUBSTRATE

CROSS-REFERENCE TO RELATED APPLICATIONS

This application is a divisional of currently pending U.S. patent application Ser. No. 13/428,004 filed on Mar. 23, 2012. The application identified above is incorporated herein by reference in its entirety for all that it contains in order to provide continuity of disclosure.

BACKGROUND OF THE INVENTION

The invention relates generally to semiconductor structures. More particularly, the invention relates to a semiconductor structure incorporating deep trench capacitors within an underlying first substrate, for access by logic circuits in a second substrate.

Trench capacitors can be used as decoupling elements or as memory elements in semiconductor structures. With traditional embedded dynamic random access memory (DRAM), in which deep trenches may be used as memory elements, a DRAM structure and a logic area must each be fabricated separately. Each of the DRAM structure and the logic area must be protected, for example, by a mask, during fabrication of the other. As semiconductor technology improves and integration density is increased, manufacture becomes more difficult. Additionally, the formation of deep trench capacitors adds cycle time to the wafer fabrication process, and can increase the number of defects that result from subjecting a substrate having logic circuits to the trench capacitor formation process.

BRIEF DESCRIPTION OF THE INVENTION

A first aspect of the disclosure provides a method comprising: providing a first substrate; doping an upper part of the first substrate to form at least one buried plate in the first substrate; forming a plurality of trenches in each of the at least one buried plate; and filling each of the plurality of trenches with a conductor to form an inner electrode in each of the plurality of trenches.

A second aspect of the disclosure provides a structure comprising: a first substrate, the first substrate including a plurality of buried plates, wherein each of the plurality of buried plates includes: a first buried plate contact and a second buried plate contact disposed on opposite sides of the buried plate, and a plurality of deep trench capacitors disposed between the first buried plate contact and the second buried plate contact; and a first oxide layer disposed over the first substrate.

A third aspect of the disclosure provides a structure comprising: a first substrate, the first substrate including a plurality of buried plates, wherein each of the plurality of buried plates includes: a first buried plate contact and a second buried plate contact disposed on opposite sides of the buried plate, and a plurality of deep trench capacitors disposed between the first buried plate contact and the second buried plate contact; a first oxide layer disposed over the first substrate; a second substrate disposed above the first oxide layer; at least one polyconductor gate disposed above the second substrate; and a second oxide layer disposed above the second substrate.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

FIGS. 8-10 show cross sectional detailed views of portion B of FIG. 3 in accordance with embodiments of the invention.

Figure 1:
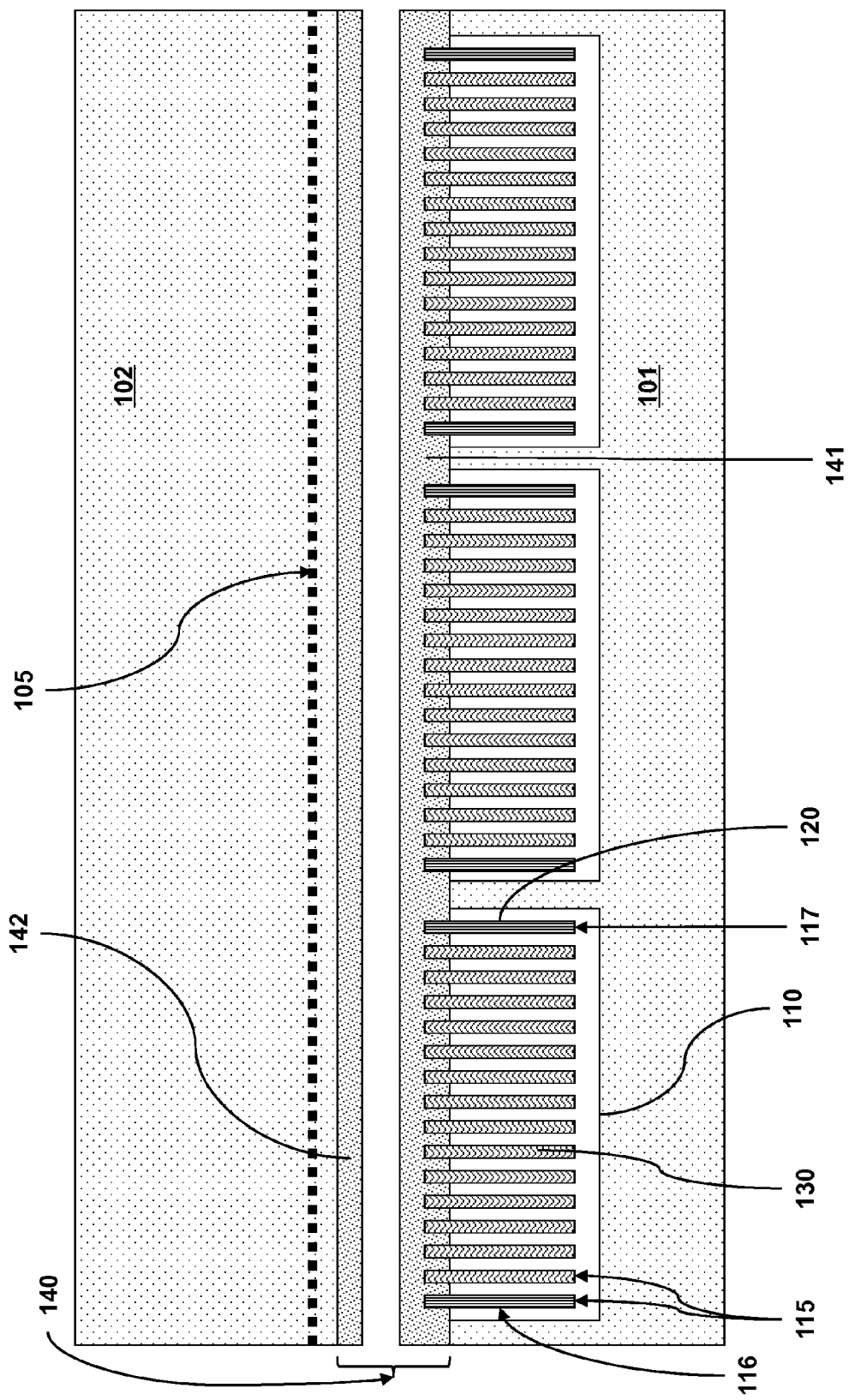
FIGS. 1-2 show a cross sectional view of a semiconductor structure in accordance with embodiments of the invention.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

As indicated above, aspects of the invention provide, and FIGS. 1-10 illustrate, a semiconductor structure 100 and a method of forming the same, including deep trench capacitors formed in an underlying first substrate 101.

With reference to FIG. 1, a first substrate 101 is provided. First substrate 101 is a handle wafer, and may include (but is not limited to) silicon (Si), germanium (Ge), silicon germanium ($Si_{1-x}Ge_x$), silicon carbide (SiC), aluminum nitride (AlN), gallium nitride (GaN), gallium arsenide (GaAs), and those consisting essentially of one or more III-V compound semiconductors having a composition defined by the formula $Al_{X1}Ga_{X2}In_{X3}As_{Y2}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include cadmium telluride (CdTe), zinc selenide (ZnSe), and other II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). A plurality of trenches 115 are formed in each of the at least one substrate 101. In some embodiments, each of the plurality of trenches 115 may be about 3.5 µm to about 4 µm deep.

At least one buried plate 110 is formed in an upper portion of first substrate 101. In one embodiment, first substrate 101 may be a P− substrate, and buried plate 110 may be an N+ doped region of the first substrate, although these conductivity types are merely illustrative. Buried plate 110 may be formed according to any of several methods.

Figure 2:
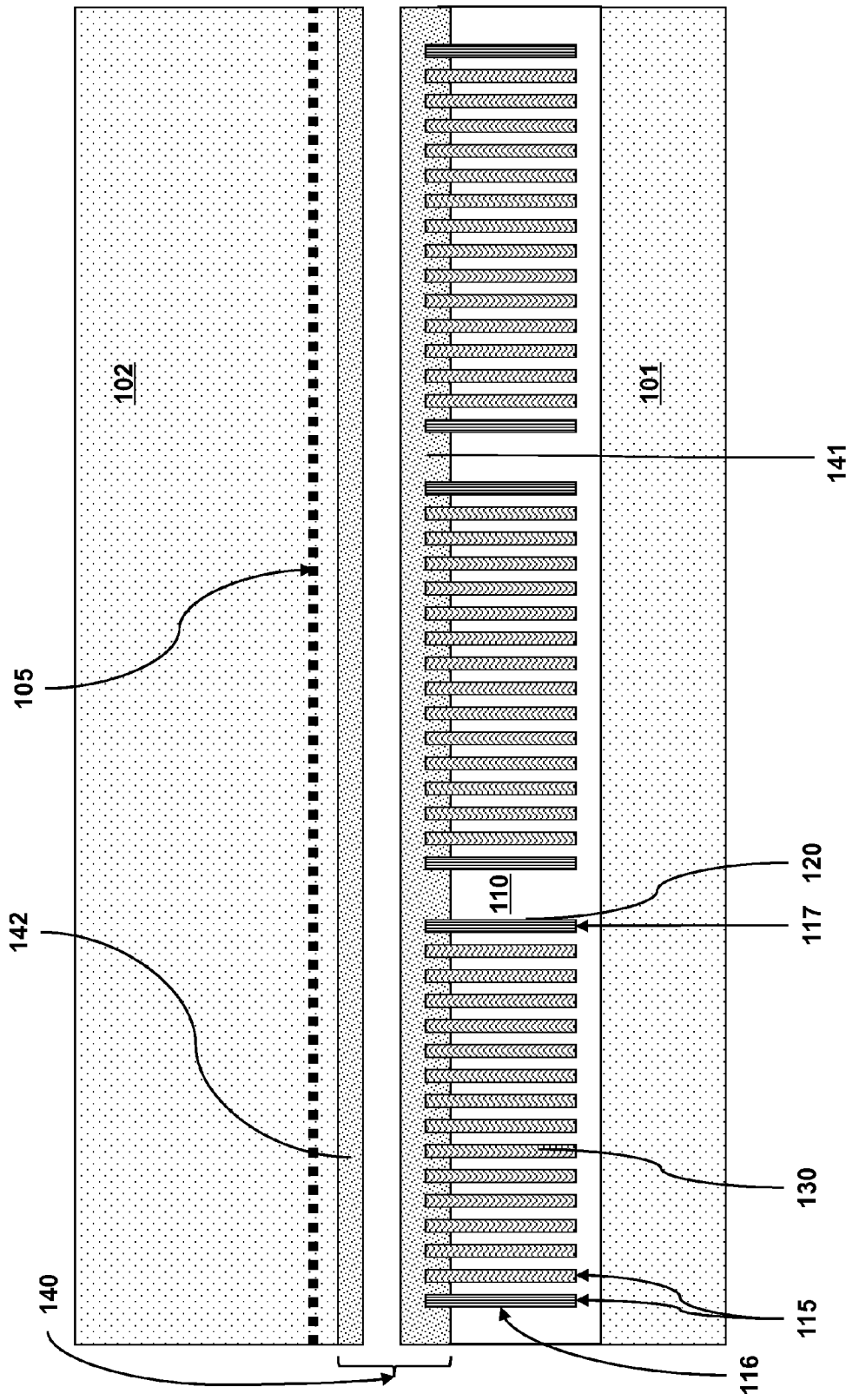

In one embodiment, buried plate 110 may be formed as an epitaxial wafer. For example, first substrate 101 may have a P− conductivity type. Silicon having a different conductivity type, e.g., N+, may be grown as an epitaxial layer on a surface of the P− first substrate 101. The epitaxial layer of N+ silicon may be, e.g., about 3.5 µm to about 4 µm thick. This produces an N+ epi wafer in which the buried plate 110 is substantially continuous along an upper portion of the first substrate 101, as shown in FIG. 2.

Figure 3:
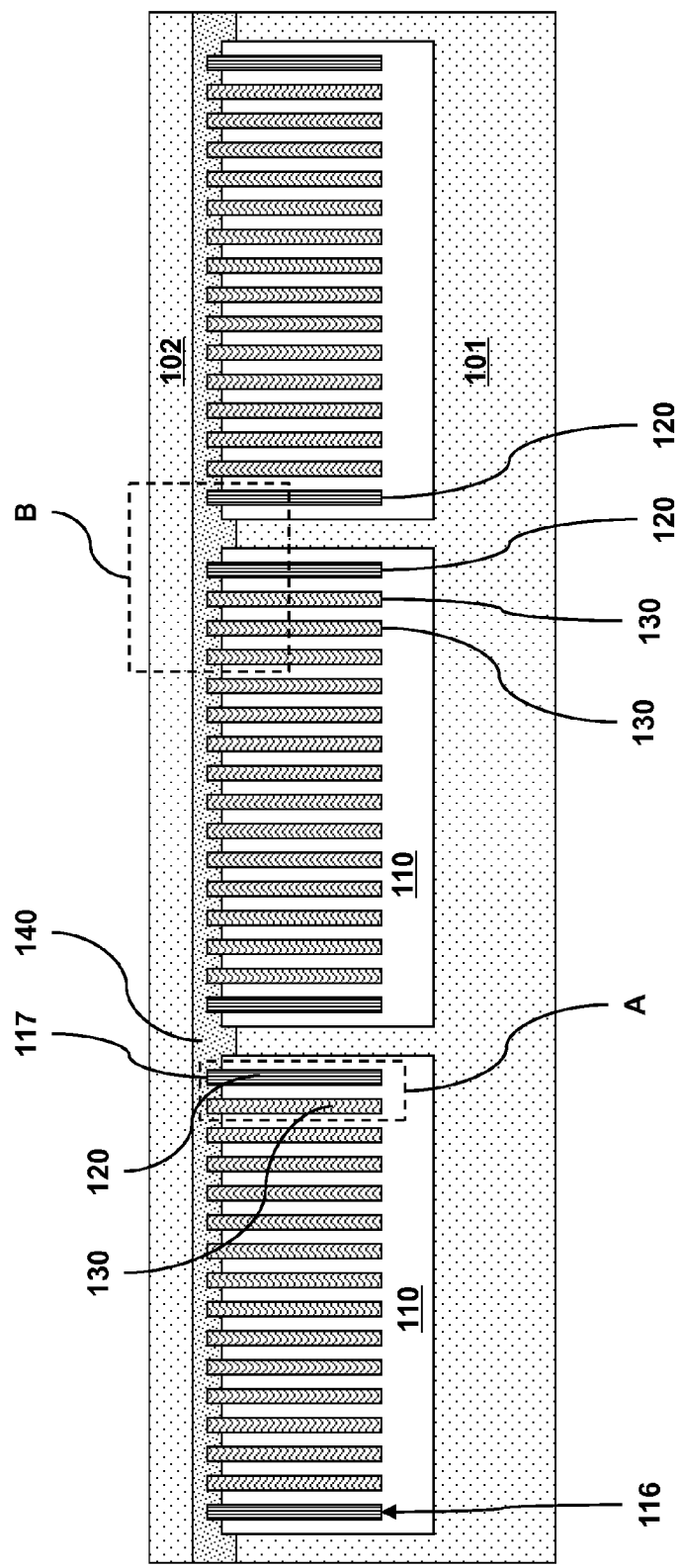
FIG. 3 shows a cross sectional view of a semiconductor structure in accordance with embodiments of the invention, including portions A and B shown in phantom.

In another embodiment, such as shown in FIGS. 1 and 3, buried plate 110 may be implanted in first substrate 101. For example, where first substrate 101 has P− conductivity, an N+ plate may be implanted. In such an embodiment, trenches 115 are formed, and first substrate 101 is subjected to the implantation. Structure 100 may be tilted to facilitate implantation along the sidewalls of trenches 115 rather than just along the floor of trenches 115. The N-type element introduced via implantation may be one of phosphorus (P), arsenic (As), or antimony (Sb), among others.

In another embodiment, buried plate 110 may be formed in first substrate 101 by exposing first substrate 101 to an arsenic atmosphere. The As-soak causes oxidation of the first substrate 101 surface and surfaces of the trenches 115. The oxide formed can then be stripped off after formation of buried plate 110. In still another embodiment, metal/insulator/metal capacitors (MIMCAP) techniques may be used to form buried plate 110.

Each trench 115 may be filled with a conductor 125 to form an inner electrode in each of the plurality of trenches 115 as described further below, with reference to FIGS. 4-7. FIGS. 4-7 show a detailed view of the area A identified in FIG. 3.

Figure 4:
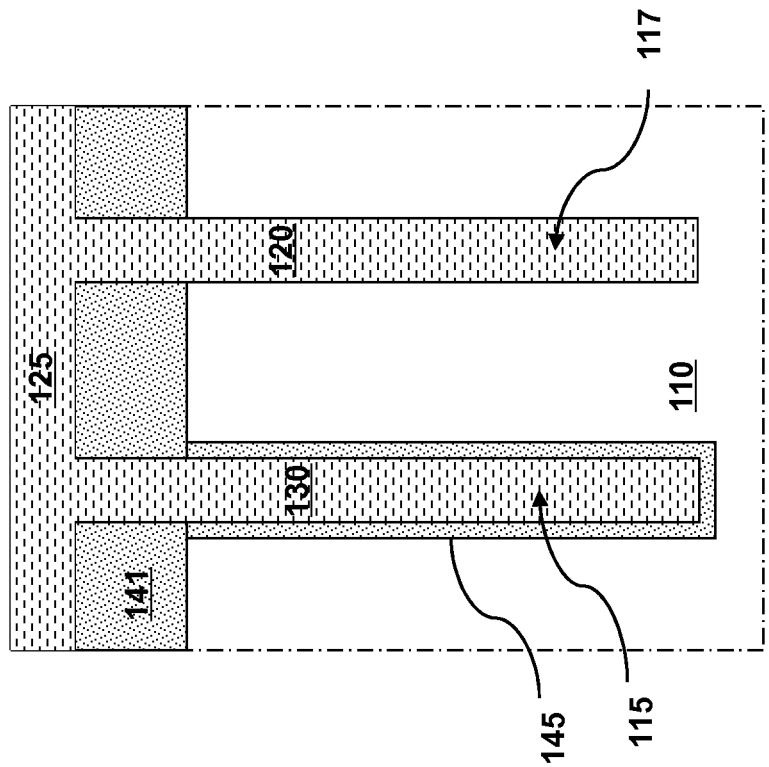
FIGS. 4-7 show cross sectional detailed views of portion A of FIG. 3 in accordance with embodiments of the invention.
Figure 5:
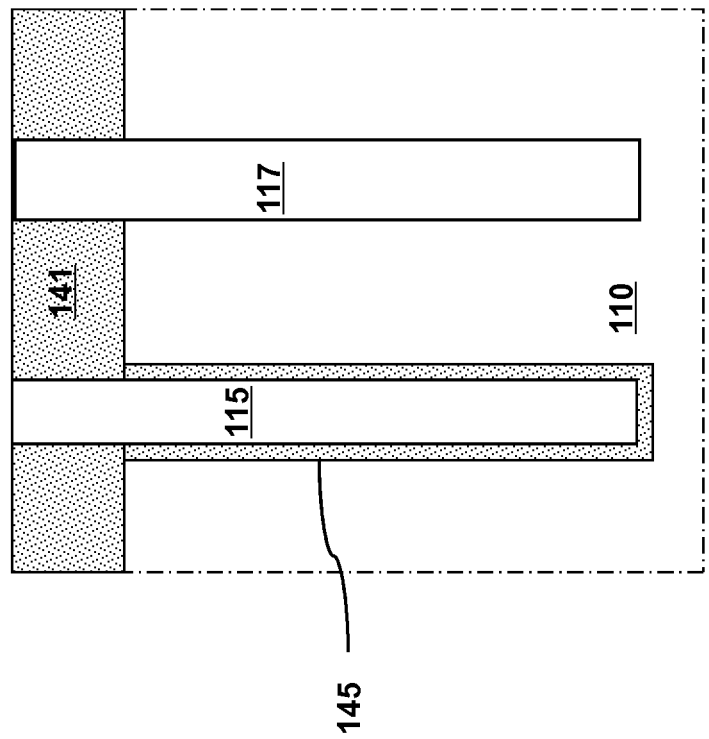

In some embodiments, as shown in FIGS. 4-5, before filling trenches 115 with conductor 125 (FIG. 5), an insulating layer 141 may be deposited over an upper surface of first substrate 101 and over trenches 115, forming a node dielectric 145 lining the inside of trenches 115 (FIG. 4). Insulating layer 141 and node dielectric liner 145 may be, for example, an oxide such as silicon oxide, silicon nitride, or a high-K metal oxide such as $HfO_2$ or $HfSiO_2$.

After node dielectric liner 145 is deposited as shown in FIG. 4, a resist mask layer (not shown) may be applied to the array of deep trenches 115 in each of the at least one buried plate 110. The resist mask layer may cover the majority of the array of deep trenches 115, leaving for example a row/column of trenches 115 uncovered. Thus, the number of trenches 115 that are covered by the mask may be fewer than all of the trenches 115. In particular, in one embodiment, all of the trenches 115 may be covered by the mask except for a first, left-most trench 116 and a second, right-most trench 117 (labeled in FIGS. 1-2, 4-5) that are left uncovered by the mask layer in each buried plate 110. This is only one possible embodiment, however; other arrangements are also possible. For example, the trenches 115 that remain uncovered by the mask may be disposed in the center of the array or another other relative location therein. Further, in embodiments such as in FIG. 2, in which first substrate 101 includes a laterally continuous buried plate 110, a plurality of trenches 115 may remain uncovered by the mask, disposed in the center of the array or another other relative location therein.

After the resist mask is deposited, a wet etch or reactive ion etch (RIE) may be applied to the exposed trenches 115 to reactively etch the node dielectric liner 145 from the sidewalls of the exposed trenches 115. In the embodiment depicted in FIGS. 4-5, the resist mask is stripped from second, right-most trench 117 and first, left-most trench 116 (not pictured in FIGS. 4-5, see FIG. 3). After the node dielectric liner 145 has been removed as shown in FIG. 4, the resist mask is stripped off and cleaned prior to the filling of the trenches 115.

This leaves trenches 115 having liner 145 (FIG. 4), and first, left-most trench 116 and second, right-most trench 117 being unlined, as shown in FIG. 4 (first, left-most trench 116 not pictured in FIG. 4). As shown in FIG. 5, a conductor 125 is deposited over the structure, forming deep trench capacitors 130 within node dielectric lined 145 trenches 115, and buried plate contacts 120 in unlined trenches such as right-most trench 117. In various embodiments, conductor 125 may be, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. Conductor 125 may further include dopants, and in one embodiment, may include doped polysilicon.

Figure 7:
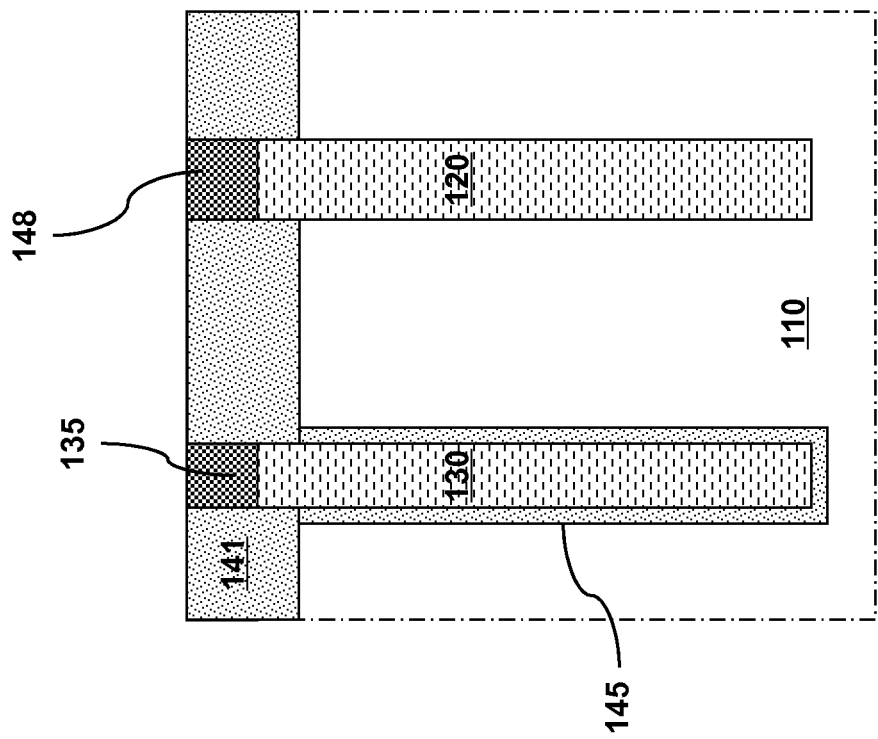
Figure 6:
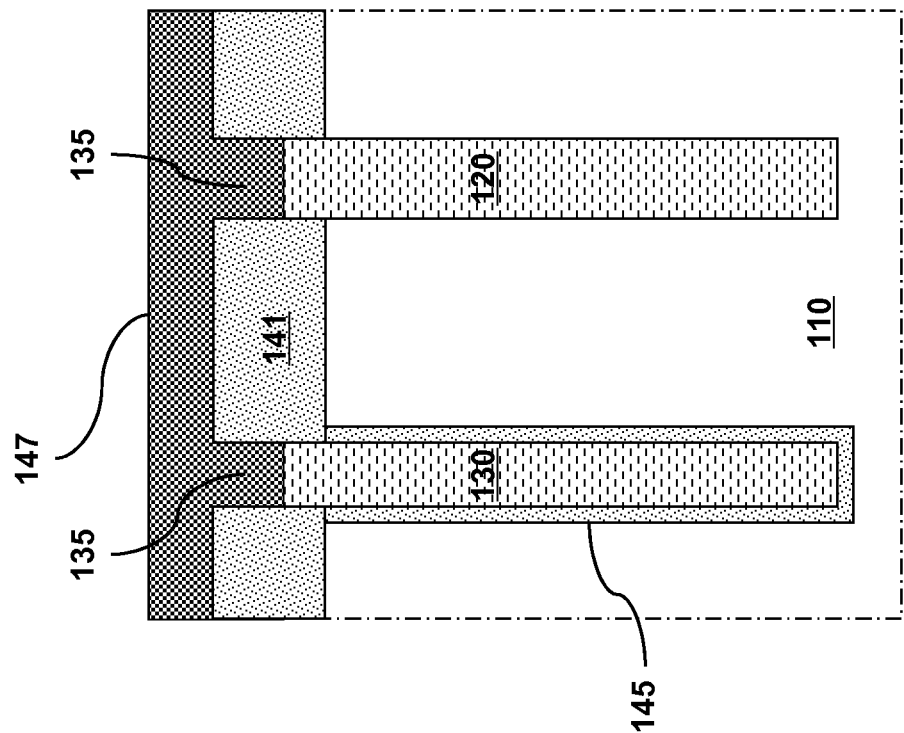

As shown in FIG. 6, in one embodiment conductor 125 may then be removed from the upper surface of insulating layer 141 using wet chemistry or reactive ion etch chemistry that is selective to the material of insulating layer 141. A recess 135 may be formed in an upper surface of the conductor 125 material of buried plate contacts 120 and deep trench capacitors 130 as shown in FIGS. 6-7. Polysilicon layer 147 may be deposited over insulating layer 141 and in the recesses 135 above buried plate contacts 120 and deep trench capacitors 130 as shown in FIG. 6.

In FIG. 7, polysilicon layer 147 may then be removed from the upper surface of insulating layer 141 by, e.g., chemical-mechanical polishing (CMP), leaving polysilicon plug 148 above each buried plate contact 120 and deep trench capacitor 130. The CMP may further improve planarity and bonding with second substrate 102, described further below. Polysilicon plug 148 seals and provides protection to the trench capacitor during subsequent processing steps. The resulting inner electrodes in buried plate contacts 120 and deep trench capacitors 130 extend vertically above an upper surface of the at least one buried plate 110, and into a thickness of first oxide layer 140 as shown in FIG. 7.

In the foregoing manner, first substrate 101 is provided with a plurality of deep trench capacitors. Groups of deep trenches 130 and buried plate contacts 120 may be arranged on substrate 101 substantially in a grid, or any other formation. The specific arrangement is not material.

Referring back to FIGS. 1-3, a second substrate 102 is provided, including a second oxide layer 142 on a bottom surface thereof. Second oxide layer 142 may be, e.g., $SiO_2$. Second substrate 102 may further include a layer of implanted hydrogen 105 disposed partway through a thickness of the second substrate 102.

Second oxide layer 142 on second substrate 102 may be bonded to first oxide layer 141 on first substrate 101. When bonded together, first and second oxide layers 141, 142 form a collective oxide layer 140 as shown in FIG. 3. Second substrate 102 may be an unprocessed substrate, having no logic circuits thereon prior to bonding to first substrate 101. Following bonding, a portion of second substrate 102 that is disposed above implanted hydrogen layer 105 may be removed as further shown in FIG. 3. The remaining, lower portion of second substrate 102 may then undergo further processing to create logic circuits which may utilize the deep trenches in underlying first substrate 101 for memory and/or decoupling as described further below.

Figure 9:
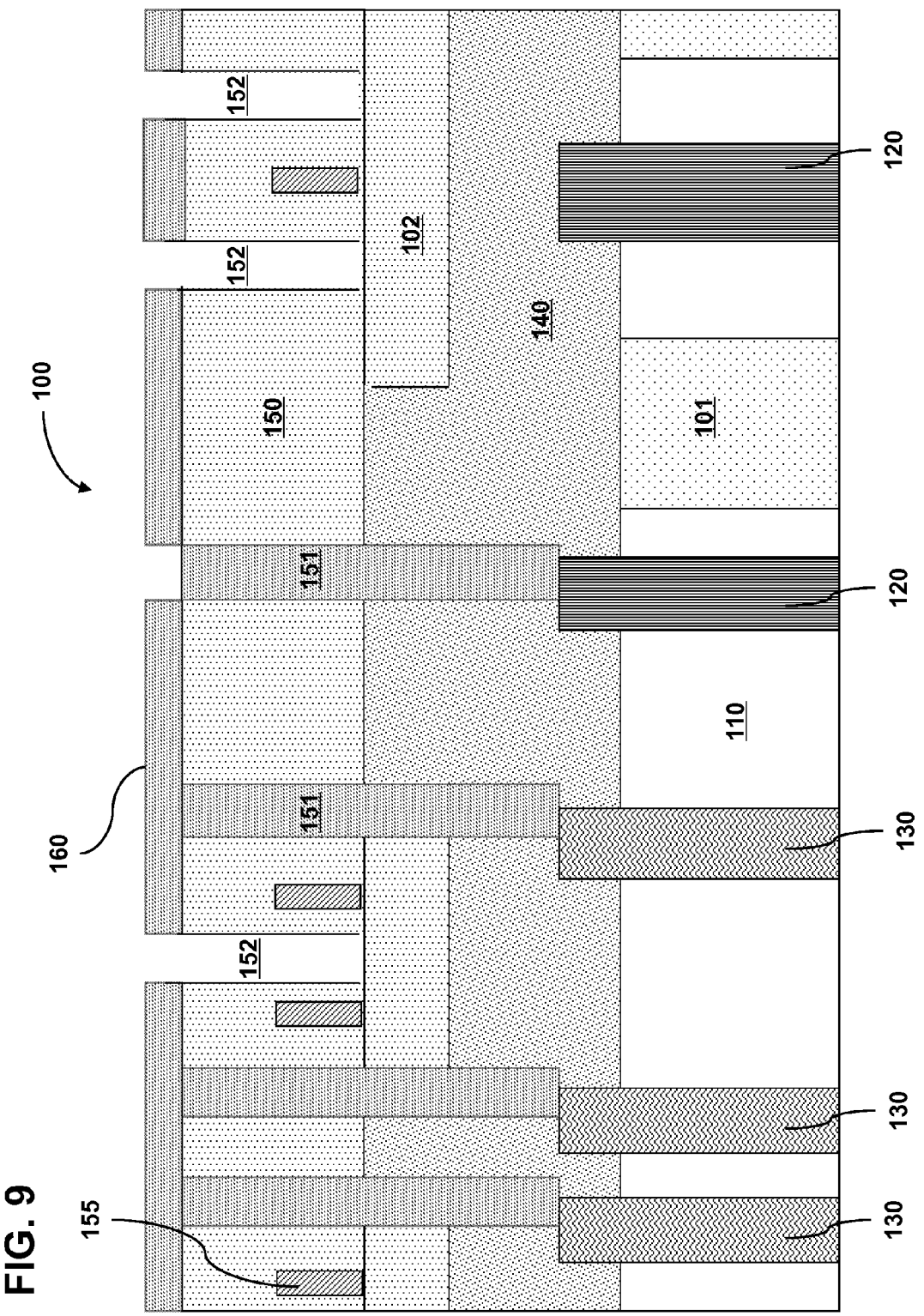
Figure 10:
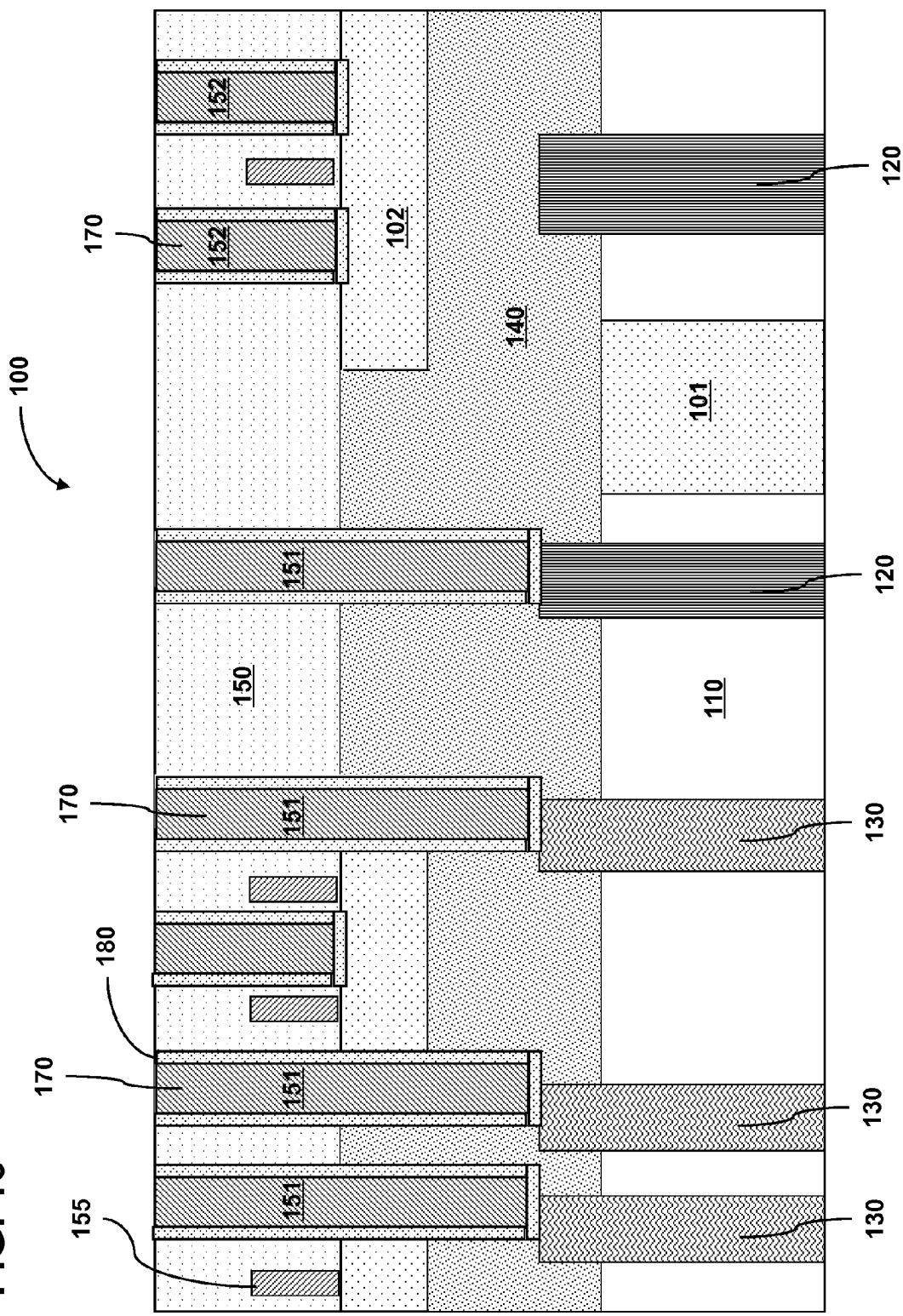

As shown in FIGS. 8-10, which show a detailed view of the area B identified in FIG. 3, the deep trench capacitors formed in first substrate 101 as described above may be accessed via contacts to utilize deep trench capacitors 130 and buried plate contacts 120 for use in decoupling and/or memory applications.

As shown in FIG. 8, at least one polyconductor gate 155 is provided, disposed above second substrate 102. A second oxide layer 150 may further be deposited over second substrate 102 and polyconductor gates 155, and planarized. A plurality of contact trenches 151 may then be formed through second oxide layer 150, extending from an upper surface of second oxide layer 150 to each of the plurality of buried plate contacts 120 and deep trench capacitors 130.

To form contact trenches 151 without damaging second oxide layer 150, a thin hardmask layer (not shown), such as a nitride/oxide bilayer or a thin amorphous carbon layer, may be deposited first on the second oxide 150 that protects the polyconductor gates 155. A resist may be applied over the hardmask bilayer, and the contact trenches 151 may be lithographically defined. Next a RIE process may be used to etch second oxide layer 150, second substrate 102, first oxide layer 140. The RIE process may stop on deep trench capacitors 130 or buried plate contacts 120 as applicable to a particular contact trench 151.

As shown in FIG. 9, after contact trenches 151 are formed a resist layer 160 may then be deposited over second oxide layer 150 and in the plurality of contact trenches 151, for defining contacts to second substrate 102. Using resist 160 as a mask, second oxide layer 150 may then be etched to form contact trenches 152 vertically extending from the surface of the second oxide layer 150 to the second substrate 102. Following formation of trenches 152, resist layer 160 may be removed as shown in FIG. 10. Contact trenches 152, like buried plate contacts 120 and deep trench capacitors 130 in first substrate 101, are formed so as to have a minimum width. Contact trenches 152 thus have a substantially similar width to that of buried plate contacts 120 and deep trench capacitors 130, as shown in FIG. 9.

As further shown in FIG. 10, a conductive material may be deposited in the plurality of contact trenches 151, 152, forming conductive contacts 170 with each of the plurality of buried plate contacts 120, deep trench capacitors 130 and second substrate 102. In some embodiments, conductive contacts 170 may include conductive materials such as, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials, with or without dopants. In further embodiments, as shown in FIG. 10, before depositing conductive material in the plurality of contact trenches 151, 152 to form conductive contacts 170, a liner 180 may be deposited on the bottom surface and sidewalls of contact trenches 151, 152. In some embodiments, liner 180 may be titanium nitride (TiN), tantalum nitride (TaN), tungsten (W), tungsten silicide ($WSi_2$), or another high temperature refractory metal.

In addition to the foregoing method, a semiconductor structure 100 is further provided herein. With reference to FIG. 10, first substrate 101 is provided (see also FIG. 3). First substrate 101 may include at least one buried plate 110, and may further include a plurality of buried plates 110. As previously noted, first substrate 101 may be a P− substrate, and buried plate(s) 110 may be an N+ doped region of the first substrate 101, although these conductivity types are merely illustrative.

Each buried plate 110 may include at least one first buried plate contact 120, and a plurality of deep trench capacitors 130 disposed about the at least one buried plate contact 120. Deep trench capacitors 130 and buried plate contacts 120 are formed in trenches 115 that are about 3.5 μm to about 4 μm deep. As shown in FIG. 7, deep trench capacitors 130 further include an insulating node dielectric liner 145 disposed about each deep trench capacitor 130, while buried plate contacts 120 are unlined. In some embodiments, deep trench capacitors 130 and buried plate contacts 120 may further include a plug 148 made of, e.g., polysilicon, disposed on an upper surface of the inner electrode made of conductor 125. Referring back to FIG. 10, a first oxide layer 140 is disposed over the first substrate 101. In some embodiments, deep trench capacitors 130 and first and second buried plate contacts 120 each vertically extend above an upper surface of the buried plate 110, and into the first oxide layer 140. This provides a handle wafer made of a first substrate 101 having a sea of deep trenches 115 available for further processing. Groups of deep trench capacitors 130 and buried plate contacts 120 may be arranged on first substrate 101 substantially in a grid, or any other formation. In various embodiments, the density of trenches will be relatively high in first substrate 101 in order to provide maximal design flexibility for logic circuits on an overlying second substrate 102, shown in, e.g., FIGS. 3 and 10. The specific arrangement of trenches 115 in first substrate 101 is not critical.

As noted, structure 100 may further include a second substrate 102 disposed above first oxide layer 140. At least one polyconductor gate 155 may be disposed on an upper surface of second substrate 102, and a second oxide layer 150 may be disposed above second substrate 102.

Where ever use of a deep trench capacitor is desired as, e.g., a memory element or a decoupling element, conductive contacts 170 may be provided, establishing a vertical connection between an upper surface of buried plate contacts 120, deep trench capacitors 130 and second substrate 102. One conductive contact 170 is provided per connection to one of a buried plate contact 120, deep trench capacitor 130, or second substrate 102. In some embodiments, conductive contact 170 may include materials such as, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials, with or without dopants. In further embodiments, conductive contacts 170 may further include a liner 180 which may be deposited on the bottom surface and sidewalls of contact trenches 151, 152. In some embodiments, liner 180 may be titanium nitride (TiN), tantalum nitride (TaN), tungsten (W), tungsten silicide ($WSi_2$), or another high temperature refractory metal.

As used herein, the terms "first," "second," and the like, do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 mm, or, more specifically, about 5 mm to about 20 mm," is inclusive of the endpoints and all intermediate values of the ranges of "about 5 mm to about 25 mm," etc.).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first substrate, the first substrate including:
at least one buried plate disposed in an upper part of the first substrate, the at least one buried plate being between about 3.5 μm and about 4 μm thick, wherein each of the at least one buried plate includes:
at least one buried plate contact,
a plurality of deep trench capacitors disposed about the at least one buried plate contact, each of the plurality of deep trench capacitors having an insulating liner, wherein the insulating liner is one of silicon oxide, silicon nitride, $HfO_2$, or $HfSiO_2$; and
a first oxide layer disposed over the first substrate.

2. The structure of claim 1, wherein the first substrate comprises a P-substrate, and the buried plate comprises a N+ doped region of the first substrate.

3. The structure of claim 1, further comprising a polysilicon plug disposed on an upper surface of at least one of the plurality of deep trench capacitors and the at least one buried plate contact.

4. The structure of claim 1, further comprising:
a second substrate disposed above the first oxide layer;
at least one polyconductor gate disposed above the second substrate; and
a second oxide layer disposed above the second substrate and the at least one polyconductor gate.

5. The structure of claim 4, further comprising:
a plurality of conductive contacts, wherein each of the plurality of conductive contacts vertically extends from an upper surface of the second oxide layer to an upper surface of one of the at least one buried plate contacts, and one of the plurality of deep trench capacitors.

6. The structure of claim 5, further comprising a liner disposed about each of the plurality of conductive contacts, wherein the liner further comprises one of titanium nitride (TiN), tantalum nitride (TaN), tungsten (W), and tungsten silicide ($WSi_2$).

7. The structure of claim 4, further comprising a layer of implanted hydrogen disposed partway through a thickness of the second substrate.

8. The structure of claim 1, wherein the plurality of deep trench capacitors and the at least one buried plate contact each vertically extend above an upper surface of the buried plate, and into the first oxide layer.

9. A structure comprising:
a first substrate, the first substrate including
at least one buried plate, wherein each of the at least one buried plate includes:
at least one buried plate contact, and
a plurality of deep trench capacitors disposed about the at least one buried plate contact;
a first oxide layer disposed over the first substrate;
a second substrate disposed above the first oxide layer;
at least one polyconductor gate disposed above the second substrate; and
a second oxide layer disposed above the second substrate and the at least one polyconductor gate.

10. The structure of claim 9, further comprising:
a plurality of tungsten conductive contacts, wherein each of the plurality of tungsten conductive contacts vertically extends from an upper surface of the second oxide layer to an upper surface of one of the at least one buried plate contact, and one of the plurality of deep trench capacitors.

11. The structure of claim 10, further comprising a liner disposed about each of the plurality of tungsten conductive contacts, wherein the liner further comprises one of titanium nitride (TiN), tantalum nitride (TaN), tungsten (W), and tungsten silicide ($WSi_2$).

12. The structure of claim 9, wherein the at least one buried plate is between about 3.5 μm and about 4 μm thick.

13. The structure of claim 9, wherein the plurality of deep trench capacitors and the at least one buried plate contact each vertically extend above an upper surface of the buried plate, and into the first oxide layer.

14. The structure of claim 9, further comprising a layer of implanted hydrogen disposed partway through a thickness of the second substrate.

* * * * *